(12) United States Patent
Lee et al.

(10) Patent No.: US 9,455,049 B2
(45) Date of Patent: Sep. 27, 2016

(54) SEMICONDUCTOR MEMORY DEVICE AND METHOD OF TESTING THE SAME

(71) Applicant: SK hynix Inc., Gyeonggi-do (KR)

(72) Inventors: Sung-Yub Lee, Gyeonggi-do (KR); Na-Yeon Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/702,380

(22) Filed: May 1, 2015

(65) Prior Publication Data

US 2016/0180965 A1    Jun. 23, 2016

(30) Foreign Application Priority Data

Dec. 19, 2014   (KR) .......................... 10-2014-0184264

(51) Int. Cl.

| | |
|---|---|
| *G11C 29/00* | (2006.01) |
| *G11C 29/08* | (2006.01) |
| *G11C 7/12* | (2006.01) |
| *G11C 8/08* | (2006.01) |
| *G11C 7/10* | (2006.01) |
| *G11C 7/06* | (2006.01) |

(52) U.S. Cl.
CPC ................ *G11C 29/08* (2013.01); *G11C 7/06* (2013.01); *G11C 7/10* (2013.01); *G11C 7/12* (2013.01); *G11C 8/08* (2013.01)

(58) Field of Classification Search
CPC ..... G11C 29/50; G11C 11/401; G11C 29/08; G11C 29/12; G11C 29/48
USPC .................................................. 365/201, 200
See application file for complete search history.

(56) References Cited

U.S. PATENT DOCUMENTS

2007/0147146 A1* 6/2007 Yamada .................. G11C 7/14
                                                                 365/200
2014/0241076 A1* 8/2014 Kwon ............. G11C 29/12005
                                                                 365/189.09

FOREIGN PATENT DOCUMENTS

KR    1020120066525    6/2012

* cited by examiner

*Primary Examiner* — Huan Hoang
(74) *Attorney, Agent, or Firm* — IP & T Group LLP

(57) ABSTRACT

A semiconductor memory device may include: a memory cell array including first and second word lines coupled to first and second memory cells, respectively; a word line driving unit suitable for selectively driving the first and second word lines; and a test control unit suitable for enabling the first word line to write test data to the first memory cell, and enabling the second word line to write the test data to the second memory cell, during a test operation.

16 Claims, 3 Drawing Sheets

SEMICONDUCTOR MEMORY DEVICE AND METHOD OF TESTING THE SAME

CROSS-REFERENCE TO RELATED APPLICATIONS

The present application claims priority of Korean Patent Application No. 10-2014-0184264, filed on Dec. 19, 2014, which is incorporated herein by reference in its entirety.

BACKGROUND

1. Field

The present invention relates to a semiconductor design technology and, more particularly, to a semiconductor memory device and a method of testing the same.

2. Description of the Related Art

In a semiconductor memory device, bit lines and word lines cross each other where their corresponding memory cells are located, and a cell transistor that stores data is arranged between each word line and each bit line. The cell transistor has a gate coupled to the word line, as well as a source and drain path coupled between the bit line and a capacitor. The node to which the drain of the cell transistor is coupled is typically referred to as a storage node. Furthermore, the contact where the source is located is referred to as the bit line contact (BLC), and a contact where the drain region is located is referred to as the storage node contact (SNC).

FIG. 1 is a diagram illustrating a conventional memory cell structure.

In a memory device including the memory cell illustrated in FIG. 1, a micro bridge may be formed between a word line WL and a storage node or between the word line WL and a bit line BL, when a storage node contact SNC and a bit line contact BLC are abnormally fabricated, or when there is a fabrication defect. This may result in a failure due to leakage of current through the micro bridge. Thus, the memory device performs a test operation to determine whether a failure (i.e. a defect) has occurred.

Such a test operation may be performed as follows. First, a plurality of word lines are enabled to write data to the corresponding memory cell through a write operation. Then, during a read operation a sense amplifier (SA) is enabled to determine whether the micro bridge is formed between the word line and the storage node or between the word line and the bit line.

During the test operation, however, one word line of the plurality of word lines may be initially enabled to write data to the memory cell in response to an external write command, and the data written to the memory cell corresponding to one word line may be used to test the other word lines. That is, the write operation on the initial one word line is not a write operation which is performed during the test operation, but a write operation which is performed during a normal operation. Thus, it inevitably becomes difficult to perform a test operation on the initial one word line.

SUMMARY

Various embodiments are directed to a semiconductor memory device capable of performing a test operation for screening defects of bit line contacts or storage node contacts.

In an embodiment, a semiconductor memory device may include: a memory cell array including first and second word lines coupled to first and second memory cells, respectively; a word line driving unit suitable for selectively driving the first and second word lines; and a test control unit suitable for enabling the first word line to write test data to the first memory cell, and enabling the second word line to write the test data to the second memory cell, during a test operation.

The first word line may include a dummy word line.

The second word line may include a plurality of normal word lines.

The word line driving unit may include. a dummy word line driving unit suitable for driving the dummy word line in response to a first test signal; and a normal word line driving unit suitable for driving the plurality of normal word lines in response to a second test signal.

The test control unit may generate the first test signal for controlling the dummy word line driving unit, and generates the second test signal which is activated after the dummy word line is enabled to write the test data to the first memory cell.

The semiconductor memory device may further include: a plurality of bit lines crossing the first and second word lines; and a bit line sense amplifier suitable for sensing and amplifying the test data loaded in the bit lines in response to a column select signal during a read operation.

The semiconductor memory device may further include: a data input/output unit suitable for receiving the test data during a write operation and outputting the test data during the read operation.

The data input/output unit may include: a write driver suitable for receiving input data as the test data to transfer the test data to the first memory cell, during the write operation; and an input/output sense amplifier suitable for outputting the test data written in the second memory cell as output data, during the read operation.

The semiconductor memory device may further include: a test determination unit suitable for comparing the output data with the input data and determining whether the second memory cell is normal or defective.

The test determination unit may include: a comparison unit suitable for comparing the output data with the input data to output a comparison signal; and a determination unit suitable for determining whether the second memory cell is normal or defective, in response to the comparison signal.

In an embodiment, a method of testing a semiconductor memory device may include: enabling a dummy word line in response to a first test signal; writing test data to a first memory cell coupled to the dummy word line; enabling a normal word line in response to a second test signal; and writing the test data written in the first memory cell to a second memory cell that is coupled to the normal word line.

The method may further may include: reading the test data written in the second memory cell during a read operation; and determining whether the second memory cell coupled to the normal word line is normal or defective, by comparing the test data written in the first memory cell with the test data read from the second memory cell.

The determining of whether the second memory cell coupled to the normal word line is normal or defective may include: comparing the test data written in the first memory cell with the test data read from the second memory cell, and outputting a comparison signal; and determining whether the second memory cell coupled to the normal word line is normal or defective, in response to the comparison signal.

The second test signal may be activated after enabling the dummy word line and writing the test data to the first memory cell coupled to the dummy word line.

The normal word line may include a plurality of normal word lines.

In an embodiment, a method of testing a semiconductor memory device may include: enabling a dummy word line of a first bank during a test operation on the first bank; writing test data to the dummy word line of the first bank; testing a plurality of normal word lines of the first bank based on the test data written in the dummy word line of the first bank; and writing normal data to a normal word line of a second bank while the plurality of normal word lines of the first bank are tested.

The testing of the plurality of normal word lines of the first bank may include: sequentially writing data to the plurality of normal word lines; sequentially reading the data written in the plurality of normal word lines; and comparing the written data with the read data.

The first and second banks may perform a write operation through one write driver

DETAILED DESCRIPTION

Figure 1:
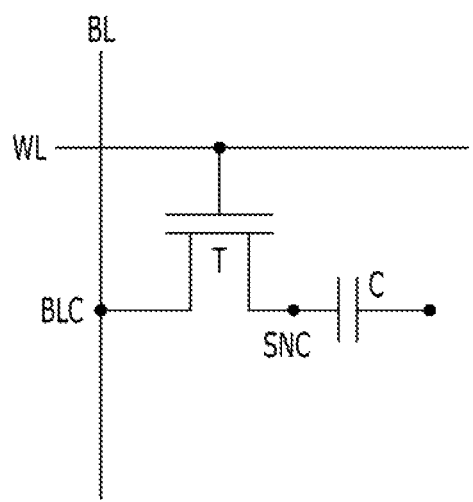
FIG. 1 is a diagram illustrating a conventional memory cell structure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

Figure 2:
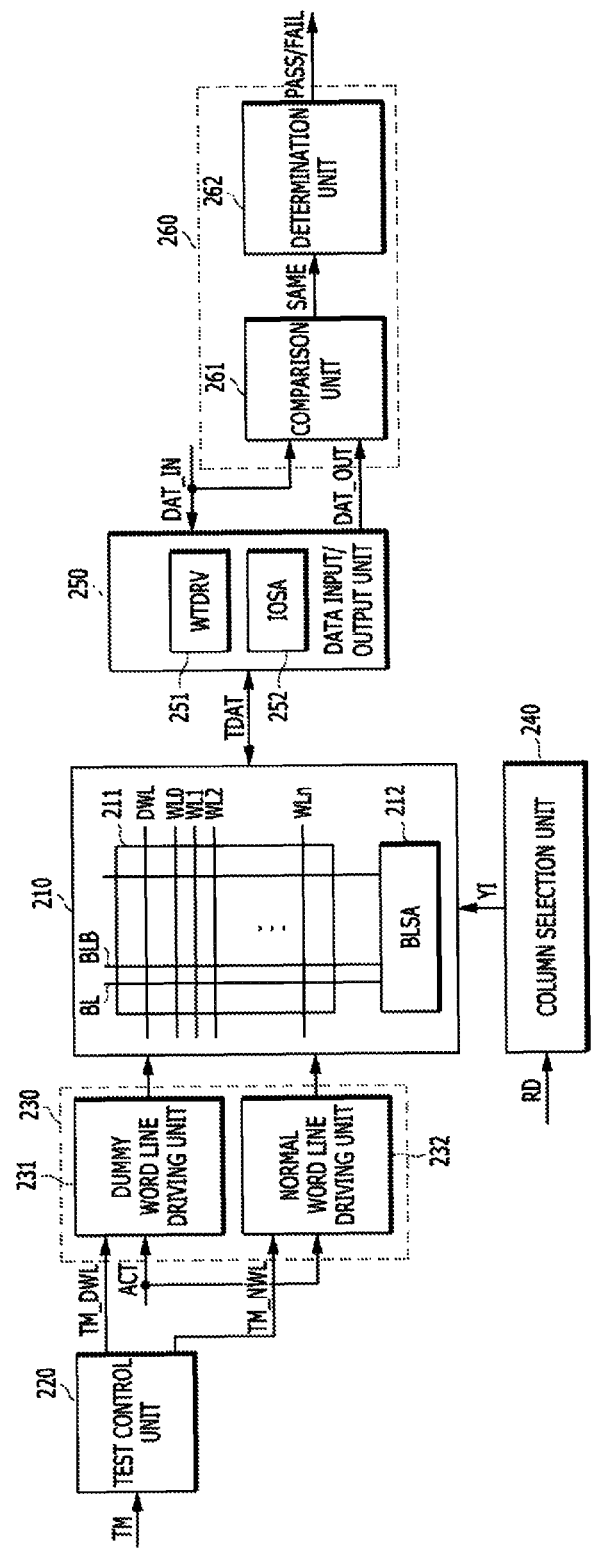
FIG. 2 is a configuration diagram of a semiconductor memory device in accordance with an embodiment of the present invention.

FIG. 2 is a configuration diagram of a semiconductor memory device in accordance with an embodiment of the present invention.

Referring to FIG. 2, the semiconductor memory device may include a memory core unit 210, a test control unit 220, a word line driving unit 230, a column selection unit 240, a data input/output unit 250, and a test determination unit 260.

The memory core unit 210 may include a memory cell array 211 and a bit line sense amplifier 212.

The memory cell array 211 may include a dummy word line DWL, a plurality of normal word lines WL0 to WLn, and a plurality of bit line pairs BL and BLB which are formed to vertically cross the dummy word line DWL and the plurality of normal word lines WL0 to WLn.

The memory cell array 211 may include a plurality of mats. In the present embodiment, only one mat will be taken as an example. When the memory cell array 211 includes a plurality of mats, a test operation may be performed in a state where mat information and sense amplifier-related signals are fixed. In the present embodiment, since the test operation is performed on one mat, the operation for fixing the mat information and the sense amplifier-related signals may be omitted.

The bit line sense amplifier 212 may sense and amplify a potential difference between the bit line pair BL and BLB and drive a data input/output line (not illustrated).

The test control unit 220 may generate a first test signal TM_DWL and a second test signal TM_NWL in response to a test mode signal TM.

The first test signal TM_DWL is a control signal for enabling the dummy word line DWL to perform the test operation, and the second test signal TM_NWL is a control signal for enabling the plurality of normal word lines WL0 to WLn to perform the test operation.

The test control unit 220 may control the second test signal TM_NWL to be activated after the test operation for the dummy word line DWL in response to the first test signal TM_DWL ending, and the second test signal TM_NWL may include word line address information for selecting any of the plurality of normal word tines WL0 to WLn.

The word line driving unit 230 may selectively drive the dummy word line DWL and the plurality of normal word lines. The word line driving unit 230 may include a dummy word line driving unit 231 and a normal word line driving unit 232.

The dummy word line driving unit 231 may enable the dummy word line DWL in response to the first test signal TM_DWL and an active command ACT, and the normal word line driving unit 232 may sequentially enable the plurality of normal word lines WL0 to WLn in response to the second test signal TM_NWL and the active command ACT.

The column selection unit 240 may generate a column select signal YI in response to a read command RD during a read operation.

The data input/output unit 250 may include a write driver 251 and an input/output sense amplifier 252.

The write driver 251 may receive input data DAT_IN as test data TDAT to transfer the test data TDAT to a corresponding memory cell during a write operation, In the present embodiment, the write driver 251 may receive and transfer the test data TDAT to a memory cell corresponding to the dummy word line DWL.

The input/output sense amplifier 252 may sense and amplify the test data TDAT loaded in the data input/output line and output the amplified data as output data DAT_OUT, during a read operation.

The test determination unit 260 may include a comparison unit 261 and a determination unit 262.

The comparison unit 261 may output a comparison signal SAME by comparing the input data DAT_IN with the output data DAT_OUT, and the determination unit 262 may output information PASS/FAIL on whether the corresponding memory cell is normal or defective, in response to the comparison signal SAME. When the input data DAT_IN and the output data DATA_OUT are equal to each other, the comparison signal SAME may be outputted to a high level. Then, the determination unit 262 may determine that the corresponding memory cell is normal. When the input data DAT_IN and the output data DAT OUT are different from each other, the comparison signal SAME may be outputted to a low level. Then, the determination unit 262 may determine that the corresponding memory cell is defective. Thus, the determination unit 262 may check whether a bit line contact BLC or storage node contact SNC of the memory cell is normally formed. The test determination unit 260 may be inside or outside the semiconductor memory device.

Hereafter, a test operation of the semiconductor memory device will be described.

During the test operation, the test control unit 220 may activate the first test signal TM_DWL, and the dummy word line driving unit 231 may receive the active command ACT from the outside (e.g. an outside source, host or testing device) in response to the first test signal TM_DWL, and enable the dummy word line DWL. As a write command (not illustrated) is applied from the outside when the dummy word line DWL is enabled, the write driver 251 may transfer the test data TDAT to a memory cell corresponding to the dummy word line DWL. In other words, the test data TDAT may be transmitted to the bit line BL which is coupled to the dummy word line DWL while vertically crossing the dummy word line DWL.

Then, the test control unit 220 may activate the second test signal TM_NWL containing the word line address information on the plurality of normal word lines WL0 to WLn. Thus, the normal word line driving unit 232 may receive the active command ACT from the outside in response to the second test signal TM_NWL, and sequentially enable the plurality of normal word lines WL0 to WLn. The plurality of normal word lines WL0 to WLn may be sequentially enabled to receive and write the test data TDAT written in the memory cell corresponding to the dummy word line DWL, to a memory cell corresponding to each of the normal word lines WL0 to WLn. In other words, the plurality of normal word lines WL0 to WLn does not perform a write operation in response to an external write command, but may be enabled in response to the active command and write the test data TDAT loaded in the bit line BL.

Furthermore, although not illustrated in the drawing, the plurality of normal word lines WL0 to WLn may be activated and then precharged in response to a control signal (not illustrated) inputted through an external pin. That is, instead of a precharge command inputted from the outside, the external control signal may be received through an unused external pin, and used as a precharge signal to precharge a word line. An active period of the control signal, that is, an active period of the precharge signal may be adjusted from the outside. Therefore, a precharge time may be controlled to reduce the test time. The external pin may include a pin for receiving a clock enable signal CKE, for example. Since the clock enable signal CKE is not used during the test operation, the clock enable signal CKE may to be used as the external control signal, that is, the precharge signal. In addition, an arbitrary pin may be designated and controlled to receive the external control signal.

As described above, the semiconductor memory device may write the test data TDAT to the memory cell corresponding to each of the normal word lines WL0 to WLn in response to the active command ACT, and then read the written test data TDAT through the read operation, thereby determining whether the bit line contact BLC and the storage node contact SNC of the corresponding memory cell are normally formed.

During the read operation, the column selection unit 240 may generate the column select signal YI in response to the read command RD, and the bit line sense amplifier 212 may sense and amplify the potential difference between the bit line pair BL and BLB in response to the column select signal YI, and transmit the test data TDAT to the data input/output line (not illustrated). At this time, the plurality of normal word lines WL0 to WLn may be sequentially enabled to output the data of the corresponding memory cells.

The data input/output line may include a segment input/output line, and the test data TDAT transmitted to the segment input/output line may be sensed and amplified through a local sense amplifier (not illustrated) and transmitted to the data input/output line, for example, a local input/output line. The test data TDAT transmitted to the local input/output line may be sensed and amplified through the input/output sense amplifier 252 and transmitted as the output data DAT_OUT to the data input/output line, for example, a global input/output line. Then, the semiconductor memory device may compare the output data DAT_OUT outputted through global input/output line during the read operation with the input data DAT_IN and determine whether the memory cell corresponding to the word line is normal or defective. When the input data DAT_IN and the output data DATA_OUT are equal to each other, the semiconductor memory device may determine that the memory cell corresponding to the word line is normal. When the input data DAT_IN and the output data DAT_OUT are different from each other, the semiconductor memory device may determine that the memory cell is defective. Thus, the semiconductor memory device may check whether the bit line contact BLC or storage node contact SNC of the memory cell is normally formed, through the test operation.

In short, the semiconductor memory device may enable the dummy word line DWL to write test data TDAT to a memory cell corresponding to the dummy word line DWL through a test operation, and may write the test data TDAT written in the memory cell corresponding to the dummy word line DWL, to memory cells corresponding to the plurality of normal word lines WL0 to WLn only through an active and precharge operation, without receiving an external word command. In other words, the plurality of normal word lines WL0 to WLn may not receive the external write command, but receive the test data written in the dummy word line DWL and perform the test operation. Thus, the test time may be reduced. In the conventional test method, since the initial word line performs an operation of writing external data, it is difficult to perform a test operation on the initial word line. In the present embodiment, however, since all word lines may be tested, the efficiency of the test operation may be improved.

Figure 3:
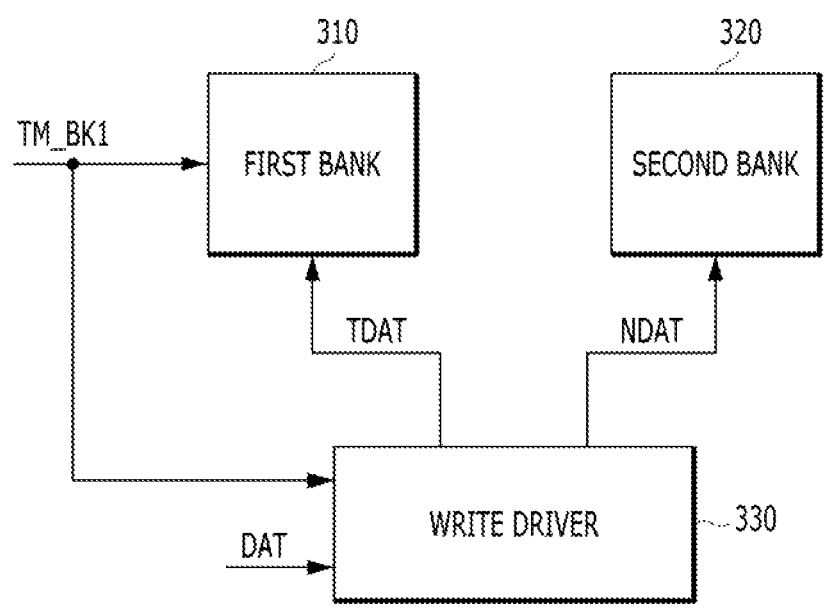
FIG. 3 is a configuration diagram of a semiconductor memory device in accordance with another embodiment of the present invention.

FIG. 3 is a configuration diagram of a semiconductor memory device in accordance with another embodiment of the present invention.

Referring to FIG. 3, the semiconductor memory device may include a first bank 310, a second bank 320, and a write driver 330.

The first bank 310 may test a word line therein in response to a test signal TM_BK1. Although not illustrated in FIG. 3, the first bank 310 may include a dummy word line and a plurality of normal word lines. As the test signal TM_BK1 is activated, the write driver 330 may receive external data DAT as test data TDAT to transfer the test data TDAT to the dummy world line in the first bank 310. Then, the first bank 310 may transmit the test data TDAT written in the dummy word line to the plurality of normal word lines, and test the plurality of normal word lines without receiving an external write command. Since a test operation of the first bank 310 is performed in the same manner as the test operation of the semiconductor memory device illustrated in FIG. 2, the detailed descriptions thereof are omitted.

After the write operation is initially performed on the dummy word line, the first bank 310 does not perform a write operation through the write driver 330 while testing the plurality of normal word lines. Thus, during a test period of the test operation on the normal word lines in the first bank 310, the write driver 330 may receive the external data DAT as normal data NDAT to transfer the normal data NDAT to the second bank 320.

In the conventional test method, since a write operation has to be performed through the write driver 330 during a period of a test operation or a period of a normal operation of the first bank 310, it is difficult to perform the write operation on another bank, for example, the second bank 320. In the present embodiment, however, the first bank 310 may initially perform the write operation in response to an external write command, only on the dummy word line, through the write driver 330. During the test operation on the normal word lines, the first bank 310 may receive the data written in the dummy word line and perform the write operation. Thus, during the test period, a write operation on the second bank 320 may be performed.

In accordance with the embodiments of the present invention, the semiconductor memory device may enable a dummy word line to write data to a memory cell corresponding to the dummy word line during a test operation, and may write the data written in the memory cell corresponding to the dummy word line to a memory cell corresponding a normal word line through an active and precharge operation, without receiving an external word command. Thus, the semiconductor memory device may reduce the time required for receiving the external write command, thereby reducing the test time.

Although various embodiments have been described for illustrative purposes, it will be apparent to those skilled in the art that various changes and modifications may be made without departing from the spirit and scope of the invention as defined in the following claims.

What is claimed is:
1. A semiconductor memory device comprising:
   a memory cell array comprising first and second word lines coupled to first and second memory cells, respectively;
   a word line driving unit suitable for selectively driving the first and second word lines; and
   a test control unit suitable for enabling the first word line to write test data to the first memory cell of a first bank, testing the second word line based on the test data written in the first word line, and enabling the second word line to write normal data to the second memory cell of a second bank, during a test operation,
   wherein the first word line comprises a dummy word line, and the second word line comprises a plurality of normal word lines.
2. The semiconductor memory device of claim 1, wherein the word line driving unit comprises:
   a dummy word line driving unit suitable for driving the dummy word line in response to a first test signal; and
   a normal word line driving unit suitable for driving the plurality of normal word lines in response to a second test signal.
3. The semiconductor memory device of claim 2, wherein the test control unit generates the first test signal for controlling the dummy word line driving unit, and generates the second test signal which is activated after the dummy word line is enabled to write the test data to the first memory cell.
4. The semiconductor memory device of claim 1, further comprising:
   a plurality of bit lines crossing the first and second word lines; and
   a bit line sense amplifier suitable for sensing and amplifying the test data loaded in the bit lines in response to a column select signal during a read operation.
5. The semiconductor memory device of claim 4, further comprising:
   a data input/output unit suitable for receiving the test data during a write operation and outputting the test data during the read operation.

6. The semiconductor memory device of claim 5, wherein the data input/output unit comprises:
   a write driver suitable for receiving input data as the test data to transfer the test data to the first memory cell, during the write operation; and
   an input/output sense amplifier suitable for outputting the test data written in the second memory cell as output data, during the read operation.
7. The semiconductor memory device of claim 6, further comprising:
   a test determination unit suitable for comparing the output data with the input data and determining whether the second memory cell is normal or defective.
8. The semiconductor memory device of claim 7, wherein the test determination unit comprises:
   a comparison unit suitable for comparing the output data with the input data to output a comparison signal; and
   a determination unit suitable for determining whether the second memory cell is normal or defective, in response to the comparison signal.
9. A method of testing a semiconductor memory device, the method comprising:
   enabling a dummy word line in response to a first test signal;
   writing test data to a first memory cell of a first bank coupled to the dummy word line;
   enabling a normal word line of the first bank in response to a second test signal; and
   writing the test data written in the first memory cell of the first bank to a second memory cell of a second bank coupled to the normal word line,
   wherein the first bank and the second bank are different banks.
10. The method of claim 9, further comprising:
   reading the test data written in the second memory cell during a read operation; and
   determining whether the second memory cell coupled to the normal word line is normal or defective, by comparing the test data written in the first memory cell with the test data read from the second memory cell.
11. The method of claim 10, wherein the determining of whether the second memory cell coupled to the normal word line is normal or defective comprises:
   comparing the test data written in the first memory cell with the test data read from the second memory cell, and outputting a comparison signal; and
   determining whether the second memory cell coupled to the normal word line is normal or defective, in response to the comparison signal.
12. The method of claim 9, wherein the second test signal is activated after enabling the dummy word line and writing the test data to the first memory cell coupled to the dummy word line.
13. The method of claim 9, wherein the normal word line comprises a plurality of normal word lines.
14. A method of testing a semiconductor memory device, the method comprising:
   enabling a dummy word line of a first bank during a test operation on the first bank;
   writing test data to the dummy word line of the first bank;
   testing a plurality of normal word lines of the first bank based on the test data written in the dummy word line of the first bank; and
   writing normal data to a normal word line of a second bank while the plurality of normal word lines of the first bank are tested.

15. The method of claim 14, wherein the testing of the plurality of normal word lines of the first bank comprises:
 sequentially writing data to the plurality of normal word lines;
 sequentially reading the data written in the plurality of normal word lines; and
 comparing the written data with the read data.

16. The method of claim 14, wherein the first and second banks perform a write operation through one write driver.

* * * * *